US012630430B2

(12) United States Patent
Liapis

(10) Patent No.: US 12,630,430 B2
(45) Date of Patent: May 19, 2026

(54) METHOD AND DEVICE FOR PRODUCING LAYERED NANOCARBON STRUCTURES

(71) Applicant: Lion Alternative Energy PLC, London (GB)

(72) Inventor: Kostas Liapis, London (GB)

(73) Assignee: Lion Alternative Energy PLC, London (GB)

( * ) Notice: Subject to any disclaimer, the term of this patent is extended or adjusted under 35 U.S.C. 154(b) by 650 days.

(21) Appl. No.: 17/854,612

(22) Filed: Jun. 30, 2022

(65) Prior Publication Data

US 2023/0009488 A1     Jan. 12, 2023

Related U.S. Application Data

(60) Provisional application No. 63/219,131, filed on Jul. 7, 2021.

(51) Int. Cl.
*C01B 32/28* (2017.01)
*C01B 32/26* (2017.01)
(Continued)

(52) U.S. Cl.
CPC .............. *C01B 32/28* (2017.08); *C01B 32/26* (2017.08); *C23C 14/025* (2013.01); *C23C 14/0605* (2013.01); *C23C 14/35* (2013.01)

(58) Field of Classification Search
CPC ......... C01B 32/28; C01B 32/26; C01B 32/05; C23C 14/025; C23C 14/0605;
(Continued)

(56) References Cited

U.S. PATENT DOCUMENTS

| 6,261,424 B1 * | 7/2001 | Goncharenko ....... C23C 14/325 |
| | | 427/304 |
| 2002/0015849 A1 * | 2/2002 | Guseva ............... C23C 14/0605 |
| | | 428/408 |

(Continued)

FOREIGN PATENT DOCUMENTS

| EP | 0881918 A2 | 12/1998 | |
| EP | 2851451 A1 * | 3/2015 | ........... C23C 14/025 |
| RU | 2564288 C2 | 9/2015 | |

OTHER PUBLICATIONS

Stanishevsky, et al., Formation of Metastable Carbon Film Structure by Pulsed Arc Plasma Deposition in Vacuum, 1996, Journal of Chemical Vapor Deposition, vol. 4, p. 297-310 (Year: 1996).*

(Continued)

*Primary Examiner* — Patrick S Ott

(74) *Attorney, Agent, or Firm* — Carter, DeLuca & Farrell, LLP; George Likourezos; Bret P. Shapiro

(57) ABSTRACT

Methods for producing layered nanocarbon structures placing a workpiece in a working chamber, applying a vacuum to the chamber, processing the workpiece surface with gas ions, applying a material sublayer to the workpiece surface, depositing carbon ions from a carbon plasma on the workpiece surface to apply an amorphous diamond-like sp3 carbon coating layer on the workpiece surface. The methods include irradiating the growing carbon coating with accelerated ions of an inert gas at a first energy range to apply a graphite sp2 carbon coating layer on the sp3 carbon coating layer and irradiating the growing carbon coating with accelerated ions of the inert gas at a second energy range, different from the first energy range, to apply a linear chain and polymer sp1 carbon coating layer on the sp2 carbon coating layer.

11 Claims, 2 Drawing Sheets

(51) Int. Cl.

| | |
|---|---|
| *C23C 14/02* | (2006.01) |
| *C23C 14/06* | (2006.01) |
| *C23C 14/35* | (2006.01) |

(58) Field of Classification Search
CPC ... C23C 14/35; C23C 14/0021; C23C 14/022; C23C 14/024; C23C 14/221; C23C 14/325; C23C 14/5833
See application file for complete search history.

(56) References Cited

U.S. PATENT DOCUMENTS

| | | | | |
|---|---|---|---|---|
| 2002/0102400 A1* | 8/2002 | Gorokhovsky | ....... C23C 14/081 | 510/307 |
| 2004/0187782 A1* | 9/2004 | McLeod | ............. C23C 14/221 | 118/715 |
| 2007/0032082 A1* | 2/2007 | Ramaswamy | ........... G03F 1/68 | 438/689 |
| 2015/0247744 A1* | 9/2015 | Tu | .......................... G01D 5/353 | 205/186 |

| | | | |
|---|---|---|---|
| 2016/0343547 A1* | 11/2016 | Lim | .................. H01L 21/68757 |

OTHER PUBLICATIONS

E.A. Buntov, et al: "2D-ordered kinked carbyne chains: DFT modeling and Raman characterization", Carbon, Elsevier Oxford, GB, vol. 117, Mar. 9, 2017 (Mar. 9, 2017), pp. 271-278.

E.I. Tochitsky, et al., "Structure and properties of carbon films prepared by pulsed vacuum arc deposition", Surface and Coatings Technology, Elsevier, NL, vol. 47, No. 1-3, Aug. 1, 1991 (Aug. 1, 1991), pp. 292-298.

Andrei V. Stanishevsky, et al: "Formation of Metastable Carbon Film Structure By Pulsed Arc Plasma Deposition in Vacuum," Journal of Chemical Vapor Deposition, Technomic Publishing, Lancaster, PA, US, vol. 4, No. 4, Apr. 1, 1996 (Apr. 1, 1996), pp. 297-310.

International Search Report and Written Opinion in corresponding International Application No. PCT/EP2022/068804 dated Nov. 7, 2022.

* cited by examiner

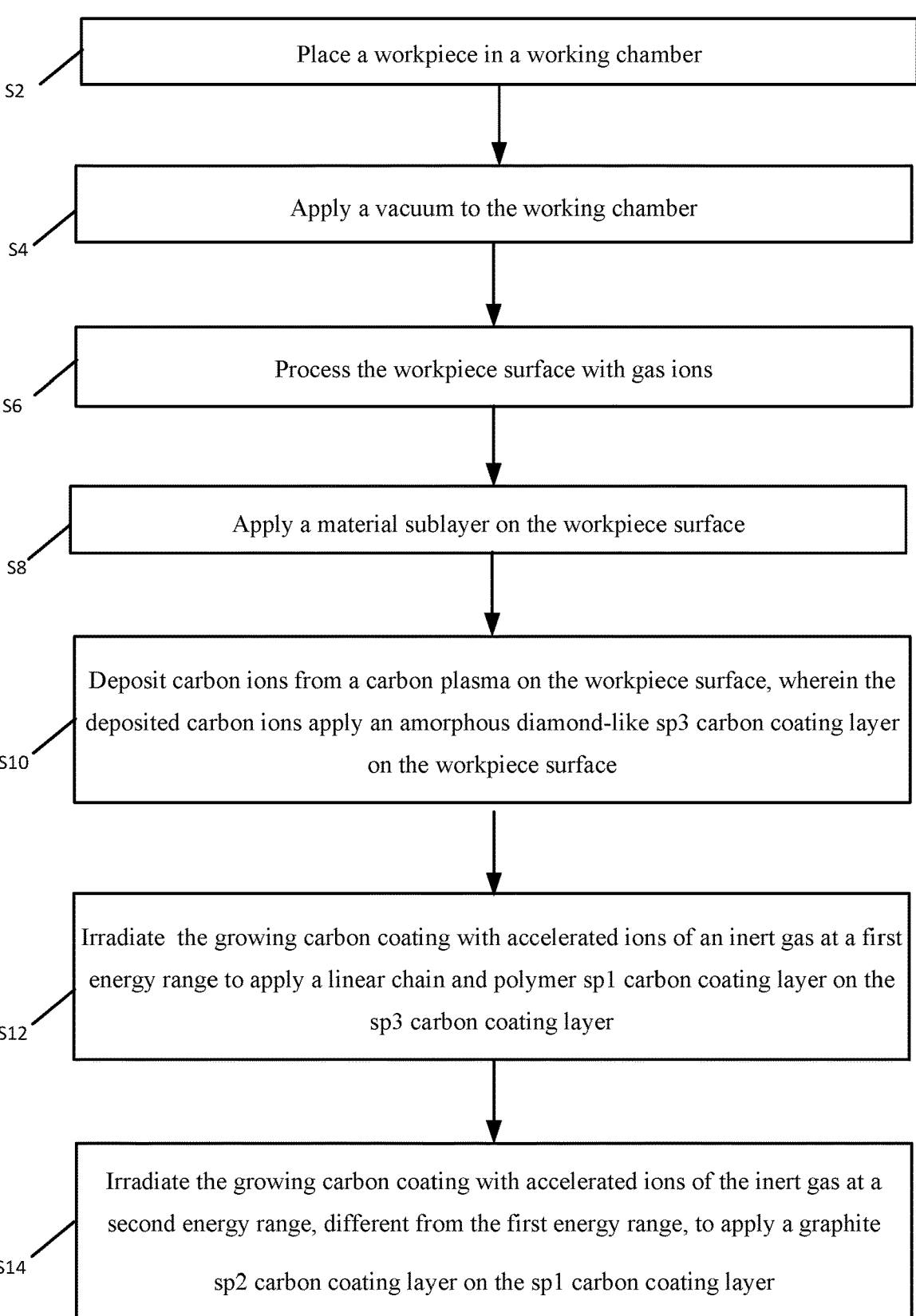

S2  Place a workpiece in a working chamber

S4  Apply a vacuum to the working chamber

S6  Process the workpiece surface with gas ions

S8  Apply a material sublayer on the workpiece surface

S10  Deposit carbon ions from a carbon plasma on the workpiece surface, wherein the deposited carbon ions apply an amorphous diamond-like sp3 carbon coating layer on the workpiece surface S12  Irradiate the growing carbon coating with accelerated ions of an inert gas at a first energy range to apply a linear chain and polymer sp1 carbon coating layer on the sp3 carbon coating layer S14  Irradiate the growing carbon coating with accelerated ions of the inert gas at a second energy range, different from the first energy range, to apply a graphite sp2 carbon coating layer on the sp1 carbon coating layer

METHOD AND DEVICE FOR PRODUCING LAYERED NANOCARBON STRUCTURES

PRIORITY

This application claims priority to U.S. Provisional Application 63/219,131 filed Jul. 7, 2021, the disclosure of which is hereby incorporated by reference.

TECHNICAL FIELD

The present application relates to the field of vacuum deposition of layered nanocarbon structures, including diamond-like carbon coatings on a surface.

BACKGROUND

Unless otherwise indicated herein, the materials described in this section are not prior art to the claims in this application and are not admitted being prior art by inclusion in this section.

Diamond-like carbon coatings may be applied to various surfaces and products such as cutting, molding, and measuring tools, friction units and machine components, and video and audio heads in electronics to protect and increase service life. Diamond-like carbon coatings may also be applied to surfaces and products to improve the biological compatibility of medical implants and instruments. Conventional diamond-like coating devices may include a pulsed carbon plasma source having electrodes connected to a voltage source, a storage, and a deflection coil (see, e.g., U.S. Pat. No. 5,078,848) or a consumable graphite cathode and anode in a vacuum housing, electrically connected to a capacitive storage connected in parallel to a DC charger, including a focusing coil with one side connected to the DC charger positive terminal and the other side connected to the anode, along with an arc ignitor connected to the ignition unit.

SUMMARY

Existing challenges associated with the foregoing, as well as other challenges, are overcome by the presently disclosed methods and devices for producing layered nanocarbon structures in vacuum.

One embodiment of the present disclosure is a method for producing layered nanocarbon structures. The method includes placing a workpiece in a working chamber, applying a vacuum to the working chamber, processing the workpiece surface with gas ions, and applying a material sublayer on the workpiece surface. The method includes depositing carbon ions from a carbon plasma on the workpiece surface. The deposited carbon ions apply a carbon coating on the workpiece surface. The method includes irradiating the growing carbon coating with accelerated ions of an inert gas at a first energy range to apply a linear chain and polymer sp1 carbon coating layer on the sp3 carbon coating layer. The method includes irradiating the growing carbon coating with accelerated ions of the inert gas at a second energy range, different from the first energy range, to apply a graphite sp2 carbon coating layer on the sp1 carbon coating layer.

In aspects, the method further includes generating at least one cathode spot on an end face of a graphite cathode and generates the carbon plasma and the at least one cathode spot moves with a speed of about 10-30 m/s and generates carbon plasma with ion energy of 40-100 eV and an ion concentration between about $10^{12}$-$10^{14}$ cm$^{-3}$.

In aspects, the inert gas is argon, and the first energy range is about 50 to about 100 eV.

In aspects, the inert gas is argon, and the second energy range is above 150 eV.

In aspects, a thickness of each amorphous diamond-like sp3 carbon coating layer, graphite sp2 carbon coating layer, and linear chain and polymer sp1 carbon coating layer is within the range of about 20 to 100 nm.

In aspects, the material sublayer is applied to the workpiece surface by a magnetron sputtering device or a stationary electric arc cathode vacuum.

In aspects, the material sublayer is a metal film with a thickness of about 10 to 50 nm.

In aspects, the metal is one of titanium, chromium, or molybdenum.

In aspects the method further includes, prior to placing the workpiece in the working chamber, performing a preliminary preparation of a workpiece surface.

In aspects, the preliminary preparation of the workpiece surface is a chemical treatment.

In aspects, the method further includes applying additional amorphous diamond-like sp3 carbon coating layers, graphite sp2 carbon coating layers, and linear chain and polymer sp1 carbon coating layers to the workpiece to produce a multi-layer coating including of a plurality of layered nanocarbon structures with a plurality of nanocarbon layers in each structure and each layered nanocarbon structure includes at least an amorphous diamond-like sp3 layer, a graphite sp2 layer, and a linear chain and polymer sp1 carbon layer.

Another embodiment of the present disclosure includes a device for producing layered nanocarbon structures in vacuum. The device includes a vacuum chamber, a carbon plasma generator, and an accelerated gas ion source. The carbon plasma generator is configured to deposit carbon ions from a generated carbon plasma on a workpiece surface. The deposited carbon ions apply an amorphous diamond-like sp3 carbon coating layer on the workpiece surface. The accelerated gas ion source is configured to irradiate the growing carbon coating with accelerated ions of an inert gas at a first energy range to apply a graphite sp2 carbon coating layer on the sp3 carbon coating layer and irradiate the growing carbon coating with accelerated ions of the inert gas at a second energy range, different from the first energy range, to apply a linear chain and polymer sp1 carbon coating layer on the sp2 carbon coating layer.

In aspects, the carbon plasma generator includes a housing. The housing includes an anode connected to the vacuum chamber and electrically connected to a solenoid, a replaceable graphite cathode within the housing and positioned out of center relative to the solenoid axis and in the direction of a workpiece, an ignition unit, and an ignition electrode coaxially located relative to the cathode.

In aspects, the carbon plasma generator generates at least one cathode spot on an end face of the graphite cathode to generate the carbon plasma.

In aspects, a longitudinal axis of the accelerated gas ion source is directed to the workpiece at an angle of about 30 to 60 degrees relative to a longitudinal axis of the replaceable graphite cathode.

In aspects, the device further includes a magnetron sputtering device configured to applying a material sublayer on the workpiece surface.

Another embodiment of the present disclosure is a workpiece having layered nanocarbon structures. The layered nanocarbon structures produced by a method including placing the workpiece in a working chamber. The method includes applying a vacuum to the working chamber. The method includes processing the workpiece surface with gas ions. The method includes applying a metal material sublayer on the workpiece surface. The method includes depositing carbon ions from a carbon plasma on the workpiece surface. The deposited carbon ions apply an amorphous diamond-like sp3 carbon coating layer on the workpiece surface. The method includes irradiating the growing carbon coating with accelerated ions of an inert gas at a first energy range to apply a graphite sp2 carbon coating layer on the sp3 carbon coating layer. The method includes irradiating the growing carbon coating with accelerated ions of the inert gas at a second energy range, different from the first energy range, to apply a linear chain and polymer sp1 carbon coating layer on the sp2 carbon coating layer.

In aspects, the layered nanocarbon structures include a plurality of layered nanocarbon structures with a plurality of nanocarbon layers in each structure and each layered nanocarbon structure includes at least an amorphous diamond-like sp3 layer, a graphite sp2 layer, and a linear chain and polymer sp1 carbon layer.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

FIG. 1 is a side view of a vacuum plasma carbon disposition system in accordance with the present disclosure; and FIG. 2 is a flow diagram for an exemplary process to produce layered nanocarbon structures in vacuum in accordance with the present disclosure.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

Figure 1:
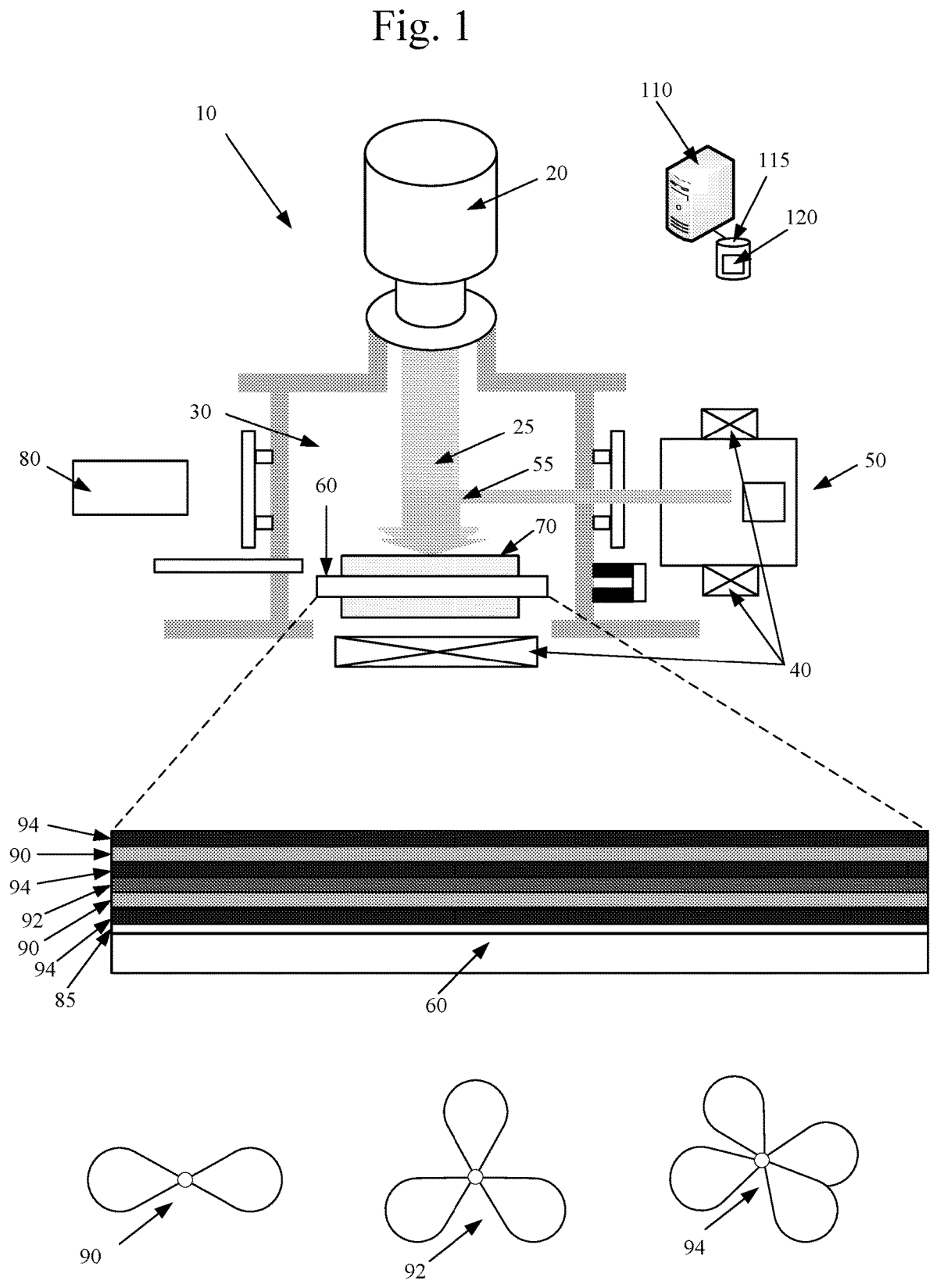

FIG. 1 depicts a vacuum plasma carbon disposition system, arranged in accordance with at least some of the embodiments described herein. System 10 may include an ion source 20, a drift chamber 30, a magnetic system 40, an arc-driven accelerator 50, a table 70, a magnetron sputtering device 80, a processor 110, and a memory 115. Memory 115 may include instructions 120. Processor 110 may be in communication with ion source 20, drift chamber 30, magnetic system 40, and arc-driven accelerator 50. A substrate 60 to be processed may be placed on table 70.

Ion source 20 may include a source of inert gas from which ion source 20 may generate working gas ions 25. Inert gas may be argon or nitrogen-containing argon. Ion source 20 may include a gas injector in the form of a ring-shaped toroid and may include an opening for cyclic injection of working gas ions into drift chamber 30. Ion source 20 may generate an ion beam current of about 0.2 mA to 1 A, an ion energy of about 50 eV to 1.5 keV, and an ion beam output with a diameter of about 10 cm.

Arc-driven accelerator 50 may be a sputtering source and may include a housing for a carbon plasma source. The housing may include an anode. The anode may be connected to vacuum drift chamber 30 and may be electrically connected to a solenoid. The arc-driven accelerator may include a replaceable metal cathode. The replaceable metal cathode may be within the housing and may be positioned out of center relative to the solenoid axis and in the direction of a workpiece or a processed product, such as substrate 60, which may be outside the cathode visibility area. A workpiece or a processed product may be any item or material to be coated with nanocarbon structures. Arc-driven accelerator may further include an ignitor with an ignition device and an ignition electrode which may be ring-shaped and may be coaxially located relative to the cathode. Arc-driven accelerator 50 may further include a cylindrical or circular inductor. Magnetic system 40 may be proximate to arc-driven accelerator 50 and may include a coil under drift chamber 30 which may create a longitudinal magnetic field within drift chamber 30. Arc-driven accelerator 50 may be configured to apply a carbon coating to substrate 60 by pulsed electric arc cathode vacuum deposition. Arc-driven accelerator 50 may apply a carbon coating to substrate 60 by generating at least one cathode spot on the end surface of the graphite cathode to generate a carbon plasma 55. The at least one cathode spot may move at a speed of 10 to 30 m/s and may generate carbon plasma 55 with ion energy of about 40 to 100 eV and an ion concentration in generated carbon plasma 55 is about $10^{12}$ to $10^{14}$ cm$^{-3}$.

In another embodiment, vacuum plasma carbon disposition system 10 may include an anode of a pulsed carbon plasma source combined with a gas injector in a single structure.

Magnetron sputtering device 80 may be configured to apply a metal film 85 with a thickness of 10 to 50 nm as a sublayer material to substrate 60. Metal film 85 may include titanium, chromium, or molybdenum. In another embodiment, metal film 85 may be applied by a stationary electric arc cathode vacuum with a thickness of 10 to 50 nm as a sublayer material to substrate 60.

Vacuum plasma carbon disposition system 10 may perform a sequential series of process operations to deposit nanocarbon structures on substrate 60 without depressurization of drift chamber 30.

Processor 110 may execute instructions 120 in memory 115 to control ion source 20 to direct accelerated gas ions 25 towards substrate 60. Ion source 20 may direct gas ions 25 towards substrate 60 to clean a surface of substrate 60. In some embodiments, processor 110 may execute instructions 120 in memory 115 to control magnetron sputtering device 80 to apply a titanium adhesive layer metal film 85 to substrate 60. Processor 110 may execute instructions 120 in memory 115 to control ion source 20 to subsequently direct gas ions 25 towards substrate 60 to repeat ion cleaning process of substrate 60. Parameters of gas ions 25 such as ion beam current and ion energy may be stored in memory 120 and selected specifically for substrate 60 by processor 110.

As described in more detail below, vacuum plasma carbon disposition system 10 may be configured to apply layered nanocarbon structures to substrate 60 with the layers including an amorphous diamond-like sp3 film, a graphite sp2 film, and a sp1 linear chain and polymer carbon film with a thickness of each layer within the range of about 20 to 100 nm.

Vacuum plasma carbon disposition system 10 may apply a sp3 carbon barrier layer to substrate 60. Vacuum plasma carbon disposition system 10 may, by processor 110 executing instructions 120 in memory 115, apply a vacuum to chamber 30 to a residual pressure of $10^{-2}$ to $10^{-3}$ Pa. Processor 110 may execute instructions 120 in memory 115 to control arc-driven accelerator 50, to supply carbon plasma 55 towards substrate 60 by pulsed electric arc cathode vacuum deposition. Processor 110 may execute instructions 120 in memory 115 to control magnetic system 40 to direct carbon plasma 55 toward substrate 60. Vacuum plasma carbon disposition system 10 may apply a sp3 carbon coating 94 to substrate 60 based on arc-driven accelerator 50 generating carbon plasma 55 directed towards substrate 60 and ion source 20 generating gas ions 25 directed towards substrate 60.

Processor 110 may execute instructions 120 in memory 115 to control parameters of ion source 20 in order to apply sp3 carbon coating 94 to substrate 60 and metal film 85 by arc-driven accelerator 50. Ion source 20 may direct gas ions 25 towards substrate 60 at an angle of 30 to 60 degrees relative to the cathode longitudinal axis of arc-driven accelerator 50. Processor 110 may execute instructions 120 in memory 115 to control ion source 20 to generate gas ions 25 with irradiated energies of inert argon ions in a narrow energy range of about 120 eV to apply sp3 carbon coating 94 to substrate 60 by arc-driven accelerator 50. In another embodiment, processor 110 may execute instructions 120 in memory 115 to control ion source 20 to not generate gas ions 25 to apply sp3 carbon coating 94 to substrate 60 previous sp3 carbon coating layer 94 by arc-driven accelerator 50.

Vacuum plasma carbon disposition system 10 may control parameters of ion source 20 in order to apply a sp1 carbon coating 90 to substrate 60 and previous sp3 carbon coating layer 94 by arc-driven accelerator 50. Processor 110 may execute instructions 120 in memory 115 to control ion source 20 to generate gas ions 25 with irradiated energies of inert argon ions in an energy range of about 50 to 100 eV to apply sp1 carbon coating 90 to substrate 60 by arc-driven accelerator 50.

Vacuum plasma carbon disposition system 10 may control parameters of ion source 20 in order to apply a sp2 carbon coating 92 to substrate 60 and previous sp1 carbon coating layer 90 by arc-driven accelerator 50. Processor 110 may execute instructions 120 in memory 115 to control ion source 20 to generate gas ions 25 with irradiated energies of inert argon ions in an energy range of above 150 eV to apply sp2 carbon coating 92 to substrate 60 and previous sp1 carbon coating layer 90 by arc-driven accelerator 50.

In one embodiment, processor 110 may execute instructions 120 in memory 115 for a preset program to control ion source 20 to apply a sp3 carbon coating 94 to substrate 60 and metal film 85 by arc-driven accelerator 50. Processor

110 may execute instructions 120 in memory 115 for the preset program to control ion source 20 to apply a biocompatible sp1 carbon coating 90 over sp3 carbon coating 94 using arc-driven accelerator 50 and ion source 20. Processor 110 may execute instructions 120 in memory 115 to apply a sp2 carbon coating 92 over sp1 carbon coating 90 based on the preset program in instructions 120 in memory 115 to control ion source 20 operating with a predetermined set of energy characteristics. The cycle may be repeated several times, with alternating sp1, sp2, and sp3 layers in any order or combination until a desired result is achieved in terms of the coating quality.

In an example, a method for producing layered nanocarbon structures in vacuum may include preliminary preparation of substrate 60 surface by a chemical treatment of substrate 60 surface, placing substrate 60 in working chamber 30, applying a vacuum to chamber 30 to a residual pressure of about $10^{-2}$ to $10^{-3}$ Pa, and processing substrate 60 surface with gas ions at an accelerating voltage of about 2 keV and a current of about 3 A. A method for producing layered nanocarbon structures in vacuum may include applying sub-layer of material metal film 85, for example titanium, on the treated surface of substrate 60 and applying a carbon coating using pulsed electric arc cathode vacuum deposition with a graphite cathode to the sub-layer of material by generating at least one cathode spot on the end surface of the graphite cathode. The at least one cathode spot may move at a speed of about 10 to 30 m/s and generate carbon plasma with ion energy of about 40 to 100 eV and an ion concentration in the generated carbon plasma may be about $10^{12}$ to $10^{14}$ cm$^{-3}$. A method for producing layered nanocarbon structures in vacuum may include depositing the resulting carbon plasma on substrate 60 surface, resulting in the production of carbon diamond-like sp3 coating 94 on substrate 60 surface, and periodically irradiating the growing carbon film with accelerated ions of an inert gas with ion energy of about 20 to 150 eV and cyclically injecting hydrocarbon and/or monomer gas into working chamber 30 up to a pressure of 0.1 to 1.0 Pa to obtain a coating of 2 to 10 sandwich structures with four layers per structure, each structure including amorphous diamond-like sp3 film 94, graphite sp2 film 92, and sp1 linear chain and polymer carbon film 90 with a thickness of each layer within the range of about 20 to 100 nm. The inert gas may be argon and nitrogen-containing argon.

The energy of irradiating inert argon ions may control the production of films with a predominant content of each carbon phase. For example, at certain configurations of plasma sources and at energies of inert argon ions of about 50 to 100 eV, a coating of linear chain carbon of the sp1 phase 90 may be produced; at energies of inert argon ions above 150 eV, a coating of sp2 graphite phase 92 may be produced; and at irradiated energies of inert argon ions in a narrow energy range of about 120 eV, a coating of sp3 phase 94 may be produced. In another example, irradiation may not be required to obtain a coating of diamond phase sp3 94 when using certain designs of carbon plasma sources.

A workpiece, such as substrate 60 may include a sublayer material, which may be metal film 85 with a thickness of 10 to 50 nm and may include titanium, chromium, or molybdenum. Metal film 85 may be obtained by a stationary electric arc cathode vacuum or a magnetron sputtering source as detailed above.

In another embodiment, processor 110 may execute instructions 120 in memory 115 to applying a negative bias voltage of about 100 to 600 V to metal film 85 of substrate 60 and synchronize the negative bias voltage with pulses from the carbon plasma source while applying carbon nano-structures to substrate 60.

In another embodiment, processor 110 may execute instructions 120 in memory 115 to select an energy of the gas ions 25 based on the type of carbon phase to be deposited during the layered structure growth and adjusting the energy of ion source 20 by a programmable ion source power supply.

In another embodiment, acetylene and/or nitrogen may be the hydrocarbon and/or monomer gas.

A device in accordance with the present disclosure may allow a diamond-like sp3 coating to be applied to elongated products. A device in accordance with the present disclosure may provide a reliable ignition system for a diamond-like sp3 coating system. A device in accordance with the present disclosure may provide uniform coating thickness to a product. A device in accordance with the present disclosure may provide a diamondlike sp3 coating without contamination of the carbon plasma. A device in accordance with the present disclosure may provide a diamondlike sp3 coating without degradation of diamond properties due to condensate precipitation. A device in accordance with the present disclosure may provide a diamondlike sp3 coating without degradation of diamond properties due to interweaving of sp1 and sp2 layers. A device in accordance with the present disclosure may apply layered nanocarbon structures to a workpiece with the layers including an amorphous diamond-like sp3 film 94, a graphite sp2 film 92, and a sp1 linear chain and polymer carbon film 90 with a thickness of each layer within the range of 20 to 100 nm. A device in accordance with the present disclosure may provide a diamondlike sp3 coating without degradation of diamond properties which may provide a protective coating that is corrosive resistant under moisture and atmospheric oxygen. A device in accordance with the present disclosure may provide a diamondlike sp3 coating which may provide fire and explosion resistance.

FIG. 2 illustrates a flow diagram for an exemplary process to produce layered nanocarbon structures in vacuum arranged in accordance with at least some embodiments presented herein. An exemplary process may include one or more operations, actions, or functions as illustrated by one or more of blocks S2, S4, S6, S8, S10, S12 and/or S14. Although illustrated as discrete blocks, various blocks may be divided into additional blocks, combined into fewer blocks, or eliminated, depending on the desired implementation.

Processing may begin at block S2, "Place a workpiece in a working chamber." At block S2, a workpiece may be placed into a chamber. The workpiece may be a substrate and the working chamber may be a vacuum chamber.

Processing may continue from block S2 to block S4, "Apply a vacuum to the working chamber." At block S4, a vacuum may be applied to the working chamber. The vacuum may be applied to a residual pressure of about $10^{-2}$ to $10^{-3}$ Pa.

Processing may continue from block S4 to block S6, "Process the workpiece surface with gas ions." At block S6, the workpiece surface may be processed with gas ions to clean the workpiece surface. The gas ions may have an accelerating voltage of about 2 keV and a current of 3 A.

Processing may continue from block S6 to block S8, "Apply a material sublayer on the workpiece surface." At block S8, a material sublayer may be applied on the workpiece surface. The material sublayer may be applied to the workpiece surface by a magnetron sputtering device or a stationary electric arc cathode vacuum. The material sublayer may be a metal film with a thickness of about 10 to 50 nm and the metal may be is one of titanium, chromium, or molybdenum.

Processing may continue from block S8 to block S10, "Deposit carbon ions from a carbon plasma on the workpiece surface, wherein the deposited carbon ions apply an amorphous diamond-like sp3 carbon coating layer on the workpiece surface." At block S10, carbon ions from a carbon plasma may be deposited on the workpiece surface. The deposited carbon ions may apply an amorphous diamond-like sp3 carbon coating layer on the workpiece surface.

Processing may continue from block S10 to block S12, "Irradiate the growing carbon coating with accelerated ions of an inert gas at a first energy range to apply a linear chain and polymer sp1 carbon coating layer on the sp3 carbon coating layer." At block S12, accelerated ions of the inert gas at a second energy range may irradiate the growing carbon coating. The accelerated ions of the inert gas at the second energy range may apply a linear chain and polymer sp1 carbon coating layer on the sp3 carbon coating layer. The inert gas may be argon and the second energy range may be about 50 to 100 eV.

Processing may continue from block S12 to block S14, "Irradiate the growing carbon coating with accelerated ions of the inert gas at a second energy range, different from the first energy range, to apply a graphite sp2 carbon coating layer on the sp1 carbon coating layer." At block S14, accelerated ions of an inert gas may irradiate the growing carbon coating. The accelerated ions of the inert gas may have a first energy range and may apply a graphite sp2 carbon coating layer on the sp1 carbon coating layer. The inert gas may be argon and the first energy range may be above 150 eV.

Finally, the processes and techniques described herein are not inherently related to any particular apparatus and may be implemented by any suitable combination of components. Further, various types of general-purpose devices may be used in accordance with the teachings described herein. It may also prove advantageous to construct specialized apparatus to perform the method steps described herein. This disclosure has been described in relation to the examples, which are intended in all respects to be illustrative rather than restrictive.

It should be understood that the foregoing description is only illustrative of the present disclosure. Various alternatives and modifications can be devised by those skilled in the art without departing from the disclosure. Accordingly, the present disclosure is intended to embrace all such alternatives, modifications, and variances. The embodiments described with reference to the attached drawing figures are presented only to demonstrate certain examples of the disclosure. Other elements, steps, methods, and techniques that are insubstantially different from those described above and/or in the appended claims are also intended to be within the scope of the disclosure.

The invention claimed is:

1. A method for producing layered nanocarbon structures, the method comprising:

placing a workpiece in a working chamber;

applying a vacuum to the working chamber;

processing a surface of the workpiece with gas ions;

applying a material sublayer on the workpiece surface;

depositing carbon ions from a carbon plasma on the workpiece surface, wherein the deposited carbon ions apply an amorphous diamond-like sp3 carbon coating layer on the workpiece surface;

irradiating the growing carbon coating with accelerated ions of an inert gas at a first energy range to apply a linear chain and polymer sp1 carbon coating layer on the sp3 carbon coating layer; and irradiating the growing carbon coating with accelerated ions of the inert gas at a second energy range, different from the first energy range, to apply a graphite sp2 carbon coating layer on the sp1 carbon coating layer.

2. The method of claim 1, further comprising generating at least one cathode spot on an end face of a graphite cathode to generate the carbon plasma and the at least one cathode spot moves with a speed of about 10-30 m/s and generates carbon plasma with ion energy of about 40-100 eV and an ion concentration in the carbon plasma generated is between about $10^{12}$-$10^{14}$ cm$^{-3}$.

3. The method of claim 1, wherein irradiating the growing carbon coating with accelerated ions of the inert gas at a first energy range includes irradiating with accelerated ions of argon at a first energy of about 50 to 100 eV.

4. The method of claim 1, wherein irradiating the growing carbon coating with accelerated ions of the inert gas at a second energy range includes irradiating with accelerated ions of argon at a second energy above 150 eV.

5. The method of claim 1, wherein applying the amorphous diamond-like sp3 carbon coating layer on the workpiece surface, applying the linear chain and polymer sp1 carbon coating layer on the sp3 carbon coating layer, and applying the graphite sp2 carbon coating layer on the sp1 carbon coating layer include applying an amorphous diamond-like sp3 carbon coating layer, graphite sp2 carbon coating layer, and linear chain and polymer sp1 carbon coating layer with a thickness of each layer within the range of about 20 to 100 nm.

6. The method of claim 1, wherein applying the material sublayer on the workpiece surface includes applying the material sublayer to the workpiece surface by a magnetron sputtering device or a stationary electric arc cathode vacuum.

7. The method of claim 6, wherein applying the material sublayer on the workpiece surface further includes applying a metal film with a thickness of about 10 to 50 nm.

8. The method of claim 7, wherein applying the material sublayer on the workpiece surface further includes applying the metal film which is one of titanium, chromium, or molybdenum.

9. The method of claim 1, further comprising, prior to placing the workpiece in the working chamber, performing a preliminary preparation of the workpiece surface.

10. The method of claim 9, wherein performing the preliminary preparation of the workpiece surface includes performing a chemical treatment on the workpiece surface.

11. The method of claim 1, further comprising applying additional amorphous diamond-like sp3 carbon coating layers, graphite sp2 carbon coating layers, and linear chain and polymer sp1 carbon coating layers to the workpiece to produce a multi-layer coating including a plurality of layered nanocarbon structures with a plurality of nanocarbon layers in each structure and each layered nanocarbon structure includes at least an amorphous diamond-like sp3 layer, a graphite sp2 layer, and a linear chain and polymer sp1 carbon layer.

*   *   *   *   *